(12) United States Patent
Minoya

(10) Patent No.: US 9,779,608 B2
(45) Date of Patent: Oct. 3, 2017

(54) ALARM OUTPUT CIRCUIT

(71) Applicant: FUJI ELECTRIC CO., LTD., Kawasaki (JP)

(72) Inventor: Yoshiaki Minoya, Matsumoto (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 112 days.

(21) Appl. No.: 14/853,961

(22) Filed: Sep. 14, 2015

(65) Prior Publication Data

US 2016/0005297 A1  Jan. 7, 2016

Related U.S. Application Data

(63) Continuation of application No. PCT/JP2014/064821, filed on Jun. 4, 2014.

(30) Foreign Application Priority Data

Jul. 5, 2013  (JP) .................. 2013-141586

(51) Int. Cl.
  G08B 1/00       (2006.01)
  G08B 21/18      (2006.01)
  (Continued)

(52) U.S. Cl.
  CPC ............. G08B 21/18 (2013.01); H03K 17/18 (2013.01); H04L 25/00 (2013.01); H02M 1/32 (2013.01)

(58) Field of Classification Search
  CPC ............... H03H 17/0072; H03H 17/02; H03H 17/0286; H03H 17/0289; H03H 17/0291; H03H 17/0292; H03K 17/00; H03K 17/002; H03K 17/28; H03K 17/30; H03M 1/12; H03M 1/124; H03M 1/1245; H03M 1/14; H03M 1/16; H03M 1/60; H03M 1/62; G08B 1/00; G08B 1/08; G08B 1/085; G08B 7/00; G08B 7/06; G08B 21/00; G08B 21/0219; G08B 21/0233; G08B 21/0236; G08B 21/0238; G08B 21/0241;
  (Continued)

(56) References Cited

U.S. PATENT DOCUMENTS 4,215,278 A * 7/1980 Barbier .................. G08B 23/00
                                                       307/116
4,333,491 A * 6/1982 Knubley ................. B60S 5/046
                                                       137/116.3
(Continued)

FOREIGN PATENT DOCUMENTS

CN        102970033 A    3/2013
JP        H05-39021 U    5/1993
(Continued)

*Primary Examiner* — Van Trieu
(74) *Attorney, Agent, or Firm* — Rabin & Berdo, P.C.

(57) ABSTRACT

An alarm output circuit can cope with simultaneous generations of a plurality of alarm factors based on alarm signals output from one output terminal. The alarm output circuit notifies externally of generations of alarm factors in an intelligent power module. A digital/analog converter, into which digital data indicating the presences and absences of generations of the alarm factors is input, outputs corresponding voltages. A voltage control oscillator outputs a signal of a frequency corresponding to an output voltage of the digital/analog converter.

11 Claims, 4 Drawing Sheets

(51) Int. Cl.
*H03K 17/18* (2006.01)
*H04L 25/00* (2006.01)
*H02M 1/32* (2007.01)

(58) Field of Classification Search
CPC  G08B 21/0244; G08B 21/0247; G08B 21/18; G08B 21/182; G08B 21/185; G08B 23/00
See application file for complete search history.

(56) References Cited

U.S. PATENT DOCUMENTS

| | | | |
|---|---|---|---|
| 5,053,983 A * | 10/1991 | Hyatt | B60R 16/0373 708/306 |
| 8,937,572 B2 | 1/2015 | Kobayashi et al. | |
| 2002/0039269 A1 | 4/2002 | Kumagai et al. | |

FOREIGN PATENT DOCUMENTS

| | | |
|---|---|---|
| JP | H08-70580 A | 3/1996 |
| JP | H09-247951 A | 9/1997 |
| JP | H10-267977 A | 10/1998 |
| JP | H11-17508 A | 1/1999 |
| JP | 2001-261192 A | 9/2001 |
| JP | 2002-027665 A | 1/2002 |
| JP | 2007-082360 A | 3/2007 |

\* cited by examiner

ALARM OUTPUT CIRCUIT

This application is a continuation under 35 U.S.C. 120 of International Application PCT/JP2014/064821 having the International Filing Date of Jun. 4, 2014, and having the benefit of the earlier filing date of Japanese Application No. 2013-141586, filed Jul. 5, 2013. Each of the identified applications is fully incorporated herein by reference.

BACKGROUND

Technical Field

The present invention relates to an alarm output circuit incorporated in an intelligent power module.

Background Art

An intelligent power module is such that a power semiconductor device, a gate drive circuit and protection circuit for the power semiconductor device, and the like, are integrated into a module. FIG. 4 shows a heretofore known example of an alarm output circuit incorporated in the intelligent power module.

Alarm factors in the intelligent power module include, for example, a drop in supply voltage (UV: Under Voltage) in agate drive circuit, overcurrent (OC: Over Current) of a power device such as an IGBT, and overheat (OH: Over Heat) and overvoltage (OV: Over Voltage) of the power device. Generations of the alarm factors are detected by respective unshown detection circuits. Detection signals output from the respective detection circuits are input into an OR circuit 1 via corresponding terminals T1, T2, T3, and T4.

(a) of FIG. 5 shows a detection signal relating to an alarm factor. The detection signal of H (High) level activates a latch timer 2 via the OR circuit 1. The latch timer 2, when no more alarm factor exists in a period in which the timer is in operation, cancels an output of the signal at a time-out point, but when some alarm factor remains at the time-out point, continues the output of the signal until the alarm factor is eliminated. The latch timer 2, when in operation, outputs a signal TM of H (High) level such as illustrated in (b) of FIG. 5.

The output signal TM of the latch timer 2 drives the gate of an output transistor 3. Consequently, the pulse signal of L (Low) level shown in (c) of FIG. 5 is output, as an alarm signal ALM, from an output terminal T5 pulled up by a resistor 4.

Meanwhile, PTL 1 discloses a device including individual pulse generating circuits, which generate pulse signals of different frequencies in response to generations of different alarm factors, and an OR circuit which inputs the pulse signals output from the respective pulse generators. According to the device, a generated alarm factor is identified from the frequency of a pulse signal output from the OR circuit.

Also, FIG. 2 of PTL 2 shows a heretofore known example having the same configuration as the alarm output circuit shown in FIG. 4. Further, FIG. 1 of PTL 2 discloses a technology wherein digital data indicating the presences and absences of generations of a plurality of alarm factors are input into a decoder, and generated alarm factors are identified by checking data output from the decoder against preset alarm factor detection data.

Furthermore, PTL 3 discloses a device including individual signal output circuits which generate pulse signals of different pulse widths in response to generations of different alarm factors. According to the device, when an alarm factor is generated, the alarm factor is identified based on the pulse width of a pulse signal output from a signal output circuit corresponding to the alarm factor.

CITATION LIST

Patent Literature

PTL 1: JP-A-11-17508
PTL 2: JP-A-10-267977
PTL 3: JP-A-8-70580

As an alarm signal ALM output from the alarm output circuit shown in FIG. 4 indicates a generation of an alarm factor, but does not indicate what the alarm factor is, the alarm output circuit has the drawback of providing no direct link to coping with the alarm factor.

Also, the devices described in PTLs 1 and 3 are such that it is possible to identify a generated alarm factor, but it is necessary to dispose as many processing circuits as the number of alarm factors in parallel, thus leading to a complex configuration and a high price.

The devices described in PTLs 1 and 3 also have the problem that it is not possible to cope with the case in which a plurality of alarm factors are simultaneously generated.

That is, with the device according to PTL 1, when a plurality of alarm factors are simultaneously generated, signals of indefinite frequencies wherein a plurality of signals of different frequencies overlap with each other are output, meaning that it is difficult to identify an alarm factor based on a frequency.

Also, with the device according to PTL 3, when a plurality of alarm factors are simultaneously generated, a plurality of pulse signals of different pulse widths are output onto the same line, meaning that the other pulse signals are hidden by a pulse signal having a longest pulse width, and as a result of this, it is only possible to identify an alarm factor corresponding to the pulse signal of the longest pulse width.

Meanwhile, according to the configuration shown in FIG. 1 of PTL 2, it is possible to cope with simultaneous generations of a plurality of alarm factors, but one output terminal does not suffice, and a plurality of output terminals are needed. An integrated circuit is such that as there are generally many cases of suffering from how to organize terminals, a one-rank higher package has to be used when the number of terminals is unduly increased. However, to use the one-rank higher package raises a problem in terms of cost and size (physical space).

Therefore, an object of the invention lies in realizing an alarm output circuit, which can also cope with simultaneous generations of a plurality of alarm factors based on alarm signals output from one output terminal, without causing an undue increase in circuit size.

SUMMARY

The invention is an alarm output circuit into which the presences and absences of generations of a plurality of alarm factors in an intelligent power module is input as logical values, and which, based on the logical values, notifies the external of the generations of the alarm factors, and achieves the object by including a digital/analog converter into which an item of digital data configured of the logical value relating to each of the alarm factors is input, and which outputs a voltage corresponding to the item of digital data; and a voltage control oscillator which outputs a signal of a frequency corresponding to the output voltage of the digital/analog converter.

As an embodiment, the invention can further include a latch timer which is activated when one of the alarm factors is generated; and a circuit which takes a logical product of the output signal of the voltage control oscillator and a signal indicating that the latch timer is in operation.

As another embodiment, the invention can further include a sample/hold circuit which, in accordance with a sample/hold signal, passes or holds the output voltage of the digital/analog converter, and be configured in such away that the voltage control oscillator outputs a signal of a frequency responding to the output voltage of the sample/hold circuit.

In this case, a logical product of the signal, which indicates that the latch timer is in operation and a signal, which selects an input or non-input of the sample/hold signal into the sample/hold circuit, can be used as the sample/hold signal for the sample/hold circuit.

Advantageous Effects of Invention

As the invention includes a digital/analog converter into which an item of digital data configured of a logical value relating to each alarm factor, and which outputs a voltage corresponding to the item of digital data; and a voltage control oscillator which outputs a signal of a frequency responding to the output voltage of the digital/analog converter, it is possible to realize an alarm output circuit, which can also cope with simultaneous generations of a plurality of alarm factors based on alarm signals output from one output terminal, without causing an undue increase in circuit size.

DETAILED DESCRIPTION

Figure 1:
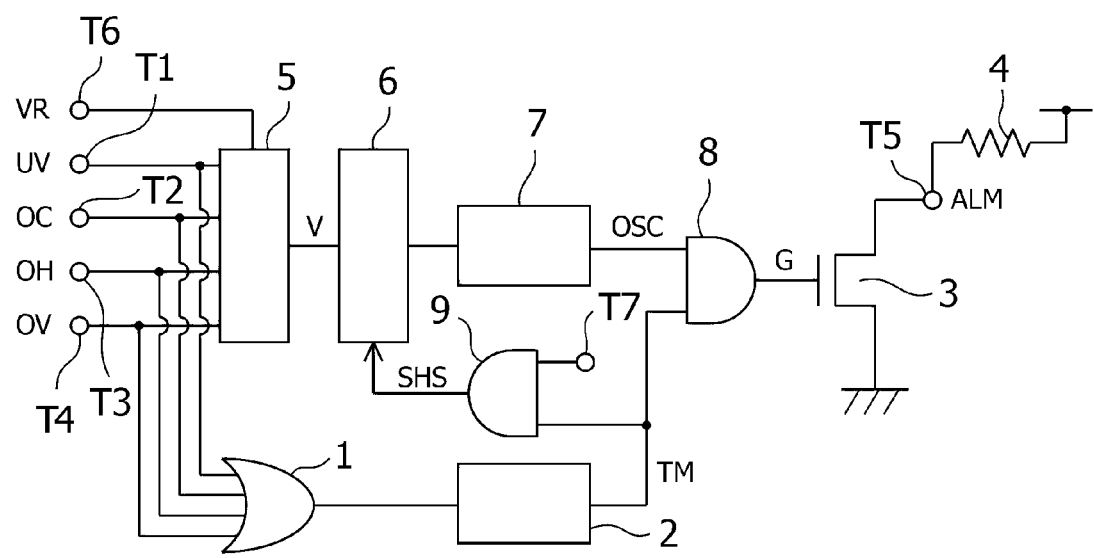
FIG. 1 is a circuit diagram showing one embodiment of an alarm output circuit according to the invention.

Hereafter, a description will be given, while referring to the drawings, of an embodiment of the invention.

Figure 2:
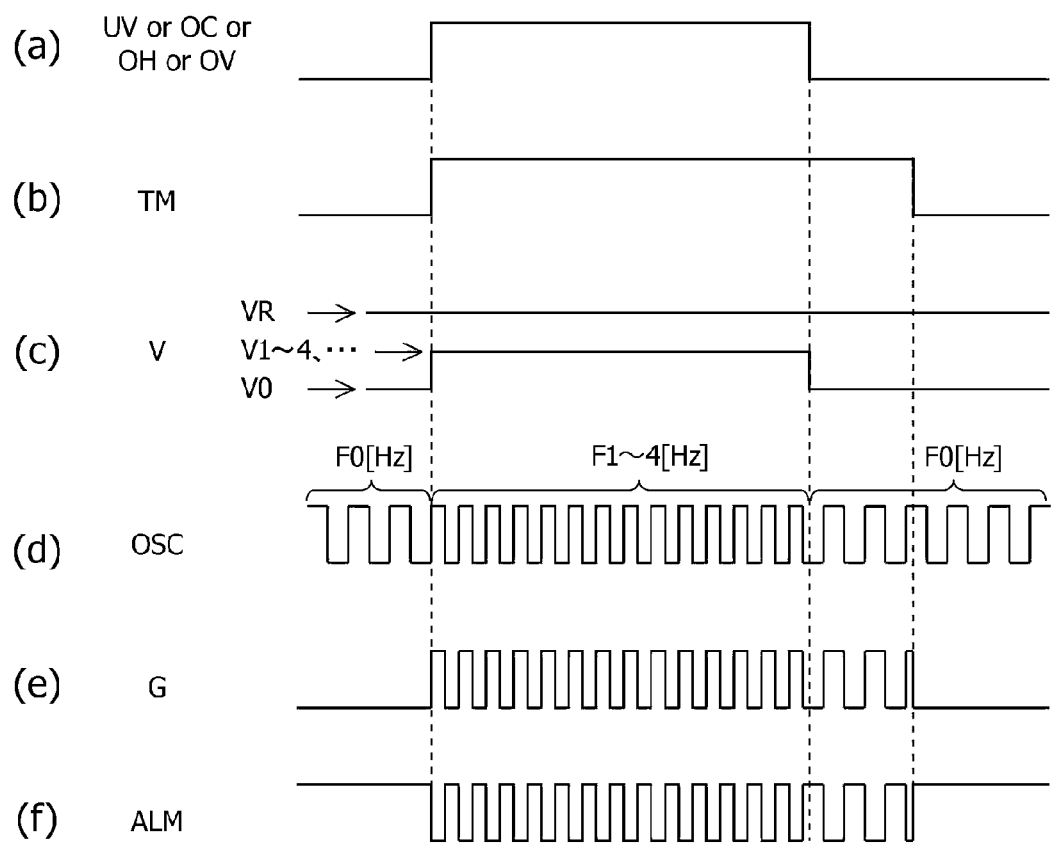
FIG. 2 is a time chart showing an operation when in a non-priority mode of the alarm output circuit according to the embodiment.

FIG. 1 shows one embodiment of an alarm output circuit according to the invention incorporated in an intelligent power module (hereafter abbreviated to an IPM), and FIG. 2 shows a time chart of the alarm output circuit. In FIG. 1, the same signs are given to elements identical to the elements shown in FIG. 4.

Figure 4:
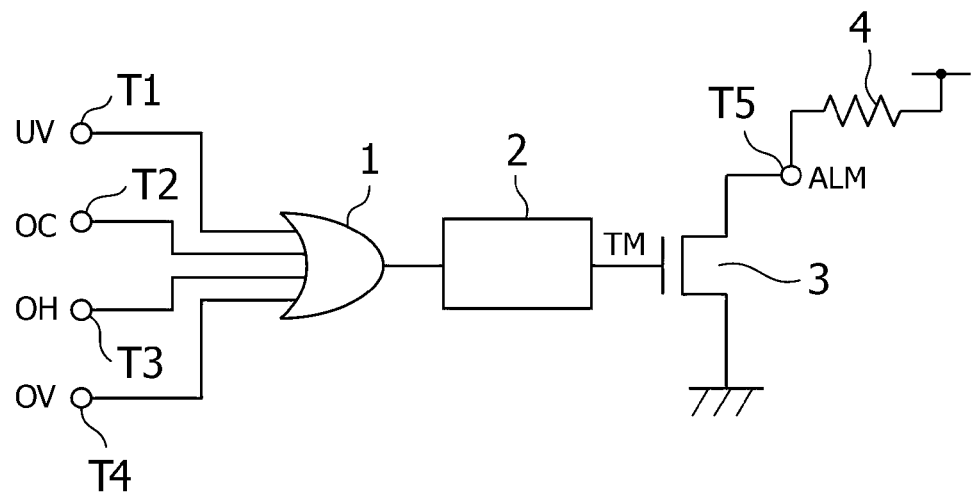
FIG. 4 is a circuit diagram showing a heretofore known example of an alarm output circuit.
Figure 5:
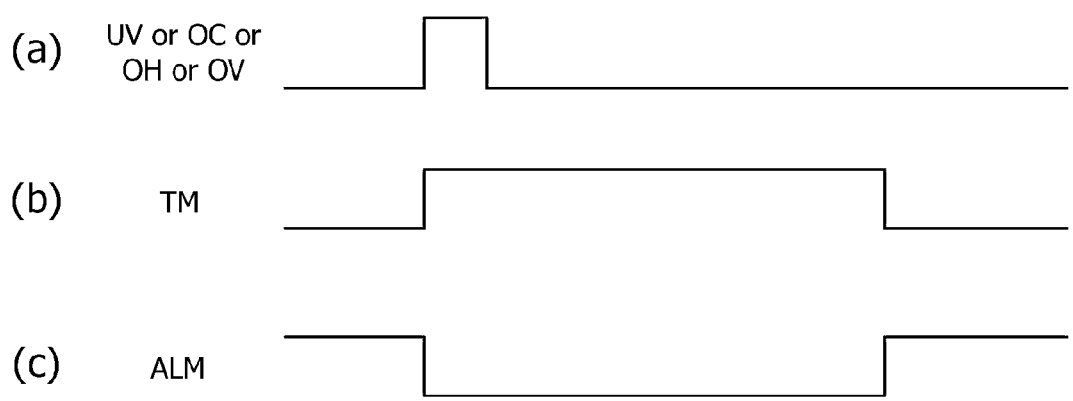
FIG. 5 is a time chart showing an operation of the alarm output circuit according to the heretofore known example.

The alarm output circuit includes, in addition to an OR circuit 1, a latch timer 2, an output transistor 3, and a pull-up resistor 4, shown in FIG. 4, a digital/analog converter (hereafter abbreviated to a D/A converter) 5, a sample/hold circuit (hereafter abbreviated to an S/H circuit) 6, a voltage control oscillator (hereafter abbreviated to a VCO) 7, an AND circuit 8, and an AND circuit 9.

In the embodiment, alarm factors of the IPM are formed of four kinds: a drop in supply voltage (UV) in a gate drive circuit or the like, overcurrent (OC) of a power device such as an IGBT, overheat (OH) and overvoltage (OV) of the power device, for ease of description, but the invention is not limited to these.

Generations of the alarm factors UV, OC, OH, and OV are detected by respective unshown detection circuits. Each detection circuit, when detecting a generation of an alarm factor, outputs a detection signal of "H (High)" level.

Logical values of outputs of the individual detection circuits are input into the D/A converter 5, as 4-bit digital data D1 (UV), D2 (OC), D3 (OH), and D4 (OV), via terminals T1, T2, T3, and T4. Consequently, a voltage V corresponding to each item of the digital data D1 to D4 is output from the D/A converter 5. Various types can be applied to the D/A converter 5, and in the embodiment, a ladder resistance type wherein a reference voltage VR input via a terminal T6 is divided by a resistor is used. The output voltage V of the D/A converter 5 is input into the S/H circuit 6.

The 4-bit digital data D1 to D4 are input into the OR circuit 1 too.

Consequently, when the logical value of one item of the digital data D1 to D4 is "H", the latch timer 2 is activated via the OR circuit 1, and as a result of this, a signal TM of "H" level such as shown in (b) of FIG. 2 is output from the latch timer 2.

As heretofore described, the latch timer 2, when no more alarm factors exist in a period in which the timer is in operation, cancels the output of the signal at a time-out point, but when some alarm factor remains at the time-out point, continues to output the signal until the alarm factor is eliminated.

The S/H circuit 6 outputs a voltage following an input voltage V at a non-hold time, and holds and outputs the input voltage V at a hold time. The VCO 7 inputs an output voltage of the S/H circuit 6, and generates a pulse signal OSC of a frequency corresponding to the voltage.

One input terminal of the AND circuit 8 is connected to the output terminal of the VCO 7, while the other input terminal is connected to the output terminal of the latch timer 2, and the output terminal of the AND circuit 8 is connected to the gate of the output transistor 3. One input terminal of the AND circuit 9 is connected to a terminal T7 to be described hereafter, while the other input terminal is connected to the output terminal of the latch timer 2, and the output terminal of the AND circuit 9 is connected to the hold signal input terminal of the S/H circuit 6.

Next, a description will be given, referring to the following truth table and FIG. 2, of an operation of the alarm output circuit according to the embodiment.

TABLE 1

| State | (MSB) D4(OV) | D3(OH) | D2(OC) | (LSB) D1(UV) | TM | Output voltage | OSC Frequency |
|---|---|---|---|---|---|---|---|
| 0 | L | L | L | L | L | V0 | F0 |
| 1 | L | L | L | H | H | V1 | F1 |
| 2 | L | L | H | L | H | V2 | F2 |
| 3 | L | L | H | H | H | V3 | F3 |
| 4 | L | H | L | L | H | V4 | F4 |
| 5 | L | H | L | H | H | V5 | F5 |
| 6 | L | H | H | L | H | V6 | F6 |
| 7 | L | H | H | H | H | V7 | F7 |
| 8 | H | L | L | L | H | V8 | F8 |
| 9 | H | L | L | H | H | V9 | F9 |
| 10 | H | L | H | L | H | V10 | F10 |
| 11 | H | L | H | H | H | V11 | F11 |
| 12 | H | H | L | L | H | V12 | F12 |
| 13 | H | H | L | H | H | V13 | F13 |

TABLE 1-continued

| State | (MSB) D4(OV) | D3(OH) | D2(OC) | (LSB) D1(UV) | TM | Output voltage | OSC Frequency |
|---|---|---|---|---|---|---|---|
| 14 | H | H | H | L | H | V14 | F14 |
| 15 | H | H | H | H | H | V15 | F15 |

A mode selection signal which selects one of a "priority mode", in which to prioritize an initially generated alarm factor, or a "non-priority mode", in which not to prioritize the initially generated alarm factor, is input into the terminal T7 from an unshown control circuit. The mode selection signal respectively exhibits "H" level and "L (Low)" level when in the "priority mode" and when in the "non-priority mode". Firstly, a description will be given of an operation when the mode selection signal is "L" level, that is, when the "non-priority mode" is selected.

In this case, as a sample/hold signal SHS output from the output terminal of the AND circuit 9 is "L" level, the S/H circuit 6 carries out no hold operation. Consequently, a voltage following the output voltage V of the D/A converter 5 is output from the S/H circuit 6.

As shown in the table, as the output voltage V of the D/A converter 5 ranges from V0 to V15 in response to the logical values of the digital data D1 to D4, the frequency of the output signal OSC of the VCO 7 also ranges from F0 to F15. The output voltage V (V0 to V15) of the D/A converter 5 is lower than the reference voltage VR. Also, supposing that i<j in the table, voltages Vi and Vj are such that Vi<Vj, and frequencies Fi and Fj are such that Fi<Fj.

Herein, supposing that no alarm factor UV, OC, OH, or OV is generated, the logical values of the digital data D1, D2, D3, and D4 are "L", "L", "L", and "L" respectively, meaning that the D/A converter 5 outputs the voltage V0 shown in (c) of FIG. 2, and S/H circuit 6 also outputs the voltage V0. Consequently, the VCO 7 generates and outputs the pulse signal OSC of the frequency F0 shown in (d) of FIG. 2 to the AND circuit 8. However, as the latch timer 2 is not activated, the signal TM is "L" level. Consequently, an output signal G of the AND circuit 8 is "L" level, as a result of which the output transistor 3 turns off, and an alarm signal ALM of "H" level is output from an output terminal T5. Therefore, the unshown control circuit, based on the fact that the alarm signal ALM is "H" level, determines that no alarm factor UV, OC, OH, or OV is generated, and as necessary, controls the inside of the IPM or a system using the IPM.

Next, supposing that one of the alarm factors UV, OC, OH, and OV is generated, a detection signal of "H" level such as shown in (a) of FIG. 2 is output from a detection circuit corresponding to the generated alarm factor.

Herein, supposing that the generated alarm factor is, for example, UV, the logical values of the digital data D1, D2, D3, and D4 are "H", "L", "L", and "L".

In this case, as the D/A converter 5 outputs a voltage V1 shown in (c) of FIG. 2 as long as these data continue, the S/H circuit 6 also outputs the voltage V1, and as a result of this, the pulse signal OSC of the frequency F1 shown in (d) of FIG. 2 is output from the VCO 7. Meanwhile, as the latch timer 2 is activated with the generation of the alarm factor UV, the signal TM of "H" level shown in (b) of FIG. 2 is output from the latch timer 2.

As the signals OSC and TM are input into the AND circuit 8, the pulse signal G of the frequency F1 shown in (e) of FIG. 2 is output from the AND circuit 8 in a period in which the logical values of the digital data D1, D2, D3, and D4 are "H", "L", "L", and "L". As a result of this, the output transistor 3 operates and switches at the frequency F1, and the alarm signal ALM of the frequency F1 shown in (f) of FIG. 2 is output from the output terminal T5. Therefore, the unshown control circuit, based on the frequency F1 of the alarm signal ALM and on the relations in the table, determines the generation of the alarm factor UV, and as well as executing a process for eliminating the factor, controls the inside of the IPM or the system using the IPM, as necessary.

When the alarm factor is cancelled, and the logical values of the digital data D1, D2, D3, and D4 are "L", "L", "L", and "L", and when the signal TM is "H" at this timing, the pulse signal G of the frequency F0 is output from the AND circuit 8, and the frequency of the alarm signal ALM is F0. The unshown control circuit determines, from the fact that the frequency of the alarm signal ALM is F0, that the alarm factor is cancelled.

When one of the other alarm factors OC, OH, and OV is generated too, an operation based on the heretofore described is executed.

Herein, a description will be given of a case in which another alarm factor is generated while one alarm factor is being generated.

For example, when the alarm factor OC is generated while the alarm factor UV is being generated, the logical values of the digital data D1, D2, D3, and D4 are "H", "H", "L", and "L", meaning that the output voltage of the D/A converter 5 and the output voltage of the S/H circuit 6 are V3, and the pulse signal OSC of the frequency F3 is output from the VCO 7. As a result of this, as the pulse signal G of the frequency F3 is output from the AND circuit 8, the alarm signal ALM of the frequency F3 is output from the output terminal T5. Therefore, the unshown control circuit, based on the frequency F3 of the alarm signal ALM and on the relations in the table, determines the simultaneous generations of the alarm factors UV and OC, and as well as executing a process for eliminating the factors, displays a result of the determination using display means, as necessary.

When another or other two alarm factors are generated while two alarm factors are being generated too, an operation based on the heretofore described is executed.

That is, for example, when the alarm factor OH is generated while the alarm factors UV and OC are being generated, the logical values of the digital data D1, D2, D3, and D4 are "H", "H", "H", and "L", meaning that the output voltage of the D/A converter 5 and the output voltage of the S/H circuit 6 are V7, and the pulse signal OSC of the frequency F7 is output from the VCO 7. As a result of this, as the pulse signal G of the frequency F7 is output from the AND circuit 8, the alarm signal ALM of the frequency F7 is output from the output terminal T5.

Also, for example, when the alarm factors OH and OV are generated while the alarm factors UV and OC are being generated, the logical values of the digital data D1, D2, D3, and D4 are "H", "H", "H", and "H", meaning that the output voltage of the D/A converter 5 and the output voltage of the S/H circuit 6 are V15, and the pulse signal OSC of the frequency F15 is output from the VCO 7. As a result of this, as the pulse signal G of the frequency F15 is output from the AND 8, the alarm signal ALM of the frequency F15 is output from the output terminal T5.

Figure 3:
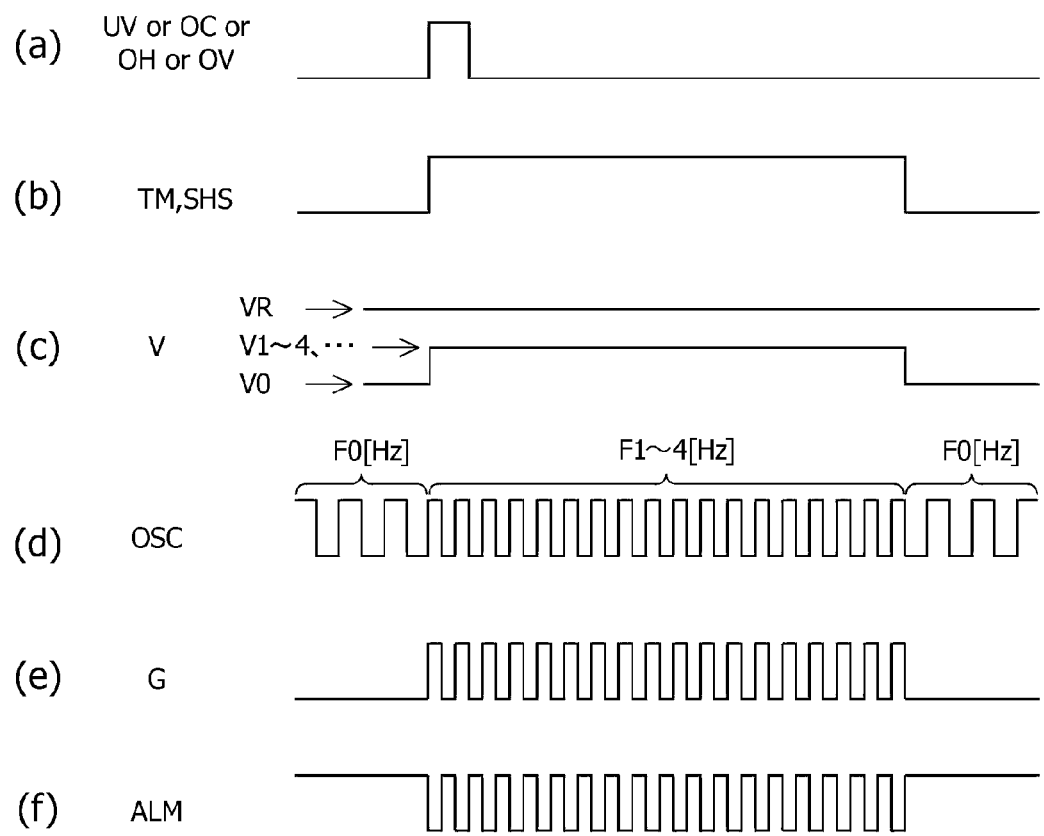
FIG. 3 is a time chart showing an operation when in a priority mode of the alarm output circuit according to the embodiment.

Next, a description will be given, using FIG. 3, of an operation when the "priority mode" in which to prioritize an initially generated alarm factor is selected, that is, when the mode selection signal of "H" level is input into the terminal T7.

For example, when the alarm factor UV is generated, the D/A converter 5 outputs the voltage V1 and the latch timer 2 is activated, as heretofore described. When the latch timer 2 is activated, the signal TM of "H" level output from the latch timer 2 is input into the one input terminal of the AND circuit 9. At this time, as the mode selection signal of "H" level is input into the other input terminal of the AND circuit 9, the sample/hold signal SHS of "H" level is output from the AND circuit 9, in synchronism with the signal TM, with the activation of the latch timer 2. As the S/H circuit 6, based on the sample/hold signal SHS of "H" level, holds the output voltage V1 of the D/A converter 5, the pulse signal OSC of the frequency F1 is output from the VCO7, and as a result of this, the ALM signal of the frequency F1 is output from the output terminal T5.

Herein, supposing that another alarm factor, for example, the alarm factor OC is generated before the latch timer 2 reaches a time-out, the output voltage of the D/A converter 5 is V3 in this case. However, at this time, as the S/H circuit 6 is maintaining a hold state, that is, as the S/H circuit 6 is continuously outputting the voltage V1, the ALM signal of the frequency F1 is continuously output from the output terminal T5 until the latch timer 2 turns off. When the alarm factors OC and OH or OC, OH, and OV are generated too, the ALM signal of the frequency F1 is continuously output from the output terminal T5 in the same way.

In this way, when the "priority mode" is selected, an initially generated alarm factor (in the heretofore described example, the alarm factor UV) is prioritized, in other words, a subsequently generated alarm factor is ignored. At or after the point when the latch timer 2 turns off, an alarm factor which is generated first after that is prioritized.

As is clear from the above description, a selection of the "priority mode" or "non-priority mode" means a selection of an input or non-input of the sample/hold signal into the S/H circuit 6, and the selection is executed by inputting the mode selection signal into the AND circuit 9.

In the heretofore described embodiment, the 4-bit digital data D1 to D4 are input into the D/A converter 5, but the digital data D1 to D4 can be input into the D/A converter 5 after being decoded by a decoder. Of course, in this case, as the D/A converter 5, a D/A converter of a configuration wherein decoded digital data can be input thereinto is used.

According to the alarm output circuit according to the heretofore described embodiment, when one of the plurality of alarm factors UV, OC, OH, and OV is generated, an alarm signal ALM of a frequency corresponding to the generated alarm factor is output. Consequently, it is possible that the control circuit side which receives the alarm signal ALM, based on the frequency of the alarm signal ALM, determines which alarm factor is generated, and carries out a control (protection, restoration, or the like) appropriate to the factor.

That is, for example, when the alarm factor OH is generated, it is desirable that the operation of the system is restored after the overheated state of the whole of the system including the IPM is settled, but in this kind of case, it is possible to select a control to restore the operation of the system after continuing an operation stop state for a longer time than when another alarm factor is generated.

Also, when the alarm factor OC is generated based on overload, a self-shutdown process is executed by a protection circuit, but it is possible, when restarting a switching control of a power device such as an IGBT after the process, to select a control to reduce a period in which the power device is turned on by a PWM control and reduce an average current flowing through the power device.

Furthermore, when the alarm factor UV or the alarm factor OV is generated, there is a suspicion of a fluctuation in the supply voltage supplied to the IPM in the system, meaning that it is possible to select a control to change the supply voltage in a rising direction when the alarm factor UV is generated and change the supply voltage in a dropping direction when the alarm factor OV is generated.

The alarm output circuit according to the embodiment can also obtain, in addition to the heretofore described advantageous effects, the advantageous effect of it also being possible to cope with simultaneous generations of a plurality of alarm factors based on alarm signals ALM output from one output terminal T5.

REFERENCE SIGNS LIST

1 OR circuit
2 Latch timer
3 Output transistor
4 Resistor
5 Digital/analog converter
6 Sample/hold circuit
7 voltage control oscillator
8 AND circuit
9 AND circuit

What is claimed is:

1. An alarm output circuit into which presences and absences of generations of a plurality of alarm factors in an intelligent power module are input as logical values, and which, based on the logical values, notifies externally of the generations of the alarm factors, the alarm output circuit comprising:
   a digital/analog converter into which an item of digital data configured of a logical value relating to one or more of each of the alarm factors is input, and which outputs a voltage corresponding to the item of digital data; and
   a voltage control oscillator which outputs a signal of a frequency corresponding to the output voltage of the digital/analog converter.

2. The alarm output circuit according to claim 1, further including:
   a latch timer which is activated when one of the alarm factors is generated; and
   a circuit which inputs a logical product of the output signal of the voltage control oscillator and a signal indicating that the latch timer is in operation.

3. The alarm output circuit according to claim 2, further including:
   a sample/hold circuit which, in accordance with a sample/hold signal, passes or holds the output voltage of the digital/analog converter, wherein
   the voltage control oscillator outputs a signal of a frequency corresponding to the output voltage of the sample/hold circuit.

4. The alarm output circuit according to claim 3, wherein
   a logical product of the signal which indicates that the latch timer is in operation, and a signal which selects an input or non-input of the sample/hold signal into the sample/hold circuit, is used as the sample/hold signal for the sample/hold circuit.

5. The alarm output circuit according to claim 1, further including:
   a sample/hold circuit which, in accordance with a sample/hold signal, passes or holds the output voltage of the digital/analog converter, wherein the voltage control oscillator outputs a signal of a frequency corresponding to the output voltage of the sample/hold circuit.

6. The alarm output circuit according to claim 5, wherein a logical product of a signal which indicates that the latch timer is in operation, and a signal which selects an input or non-input of the sample/hold signal into the sample/hold circuit, is used as the sample/hold signal for the sample/hold circuit.

7. A logic device, comprising:
a digital-to-analog converter configured to receive a plurality of inputs respectively corresponding to alarm signals, and in response to one or a combination of the alarm signals being generated, to output a voltage level corresponding to the one or the combination of generated alarm signals; and
a frequency generator configured to output a frequency corresponding to the voltage level.

8. The logic device of claim 7, further comprising:
a timing device configured to receive the plurality of inputs respectively corresponding to alarm signals, and to output a timing signal indicating whether at least one alarm signal has been generated; and
an output logic device configured to receive the timing signal and the frequency corresponding to the voltage level, and to output the frequency corresponding to the voltage level if the timing signal indicates that at least one alarm signal has been generated.

9. The logic device of claim 8, further comprising:
a sample-and-hold device configured to receive the voltage level corresponding to the one or the combination of generated alarm signals from the digital-to-analog converter and to output the voltage level to the frequency generator; and
a mode selection device configured to receive the timing signal and a mode selection signal, and to output the mode selection signal to the sample-and-hold device if the timing signal indicates that at least one alarm signal has been generated;
wherein the sample-and-hold device is further configured to, in response to the mode selection signal, output to the frequency generator a voltage level that corresponds to an alarm signal initially generated until the timing signal indicates that no alarm signal has been generated.

10. The logic device of claim 8, wherein the timing device includes an OR gate configured to receive the plurality of inputs respectively corresponding to alarm signals, and a latch timer configured to receive an output of the OR gate.

11. The logic device of claim 7, wherein the frequency generator includes a voltage-controlled oscillator.

* * * * *